(12) United States Patent
Zhong et al.

(10) Patent No.: US 9,613,946 B2
(45) Date of Patent: Apr. 4, 2017

(54) LOW VOLTAGE TRIGGERED SILICON CONTROLLED RECTIFIER WITH HIGH HOLDING VOLTAGE AND SMALL SILICON AREA

(71) Applicant: SEMICONDUCTOR MANUFACTURING INTERNATIONAL (SHANGHAI) CORPORATION, Shanghai (CN)

(72) Inventors: Lei Zhong, Shanghai (CN); Hongwei Li, Shanghai (CN); Wei Lei, Shanghai (CN); Guang Chen, Shanghai (CN); Huijuan Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/179,321

(22) Filed: Jun. 10, 2016

(65) Prior Publication Data
US 2016/0372455 A1 Dec. 22, 2016

(30) Foreign Application Priority Data
Jun. 18, 2015 (CN) .......................... 2015 1 0340942

(51) Int. Cl.
| | | |
|---|---|---|
| *H01L 29/66* | (2006.01) | |
| *H01L 27/02* | (2006.01) | |
| *H01L 29/08* | (2006.01) | |
| *H01L 29/10* | (2006.01) | |

(52) U.S. Cl.
CPC ........ *H01L 27/0262* (2013.01); *H01L 29/083* (2013.01); *H01L 29/1004* (2013.01)

(58) Field of Classification Search
CPC ............. H01L 27/0262; H01L 27/0285; H01L 27/0292; H01L 29/083; H01L 29/1004; H01L 29/74
USPC .................................................. 257/173, 146
See application file for complete search history.

(56) References Cited

U.S. PATENT DOCUMENTS

| | | |
|---|---|---|
| 5,072,273 A | 12/1991 | Avery |
| 6,521,487 B1 * | 2/2003 | Chen ................... H01L 27/0617 257/E21.389 |
| 2011/0133247 A1 | 6/2011 | Sarbishaei et al. |

* cited by examiner

*Primary Examiner* — Tu-Tu Ho
(74) *Attorney, Agent, or Firm* — Kilpatrick Townsend and Stockton LLP

(57) ABSTRACT

A semiconductor device includes a P-type semiconductor substrate, a first N-well, a second N-well, and a P-well adjoining the first and second N-wells, a first doped region having a first conductivity type within the first N-well, a second doped region having a second conductivity type bridging the first N-well and the P-well, a third N+ doped region bridging the second N-well and the P-well, a fourth P+ doped region within the second N-well and spaced apart from the third N+ doped region, and a gate structure formed on the surface of the P-well and between the second doped region and the third N+ doped region. The gate structure, the second doped region, and the third N+ doped region form an NMOS structure. The semiconductor device is a low voltage triggered SCR having a relatively small silicon area and high holding voltage.

8 Claims, 2 Drawing Sheets ns to Chinese patent appli-
LOW VOLTAGE TRIGGERED SILICON CONTROLLED RECTIFIER WITH HIGH HOLDING VOLTAGE AND SMALL SILICON AREA

CROSS-REFERENCES TO RELATED APPLICATIONS

This application claims priority to Chinese patent application No. 201510340942.9, filed Jun. 18, 2015, the content of which is incorporated herein by reference in its entirety.

This application is related to co-pending application entitled "ZENER-TRIGGERED SILICON CONTROLLED RECTIFIER WITH SMALL SILICON AREA," by Lei Zhong, Hongwei Li, Wei Li, and Huijivan Cheng, filed Apr. 7, 2016 (U.S. application Ser. No. 15/093,725), the content of which is incorporated herein by reference in its entirety.

FIELD OF INVENTION

The present invention relates generally to semiconductor technology, and more particularly to an improved low-voltage triggered silicon controlled rectifier with high holding voltage and small silicon area, and an electronic apparatus containing the same.

BACKGROUND OF THE INVENTION

In the field of semiconductor technology, the electrostatic discharge (ESD) phenomenon poses a major threat to the reliability of an integrated circuit (IC) device. As advances in integrated circuit technology enable the decrease in the feature size of circuit elements, the design of reliable ESD protection has become a more difficult and more challenging task in nanoscale CMOS technology.

Silicon-controlled rectifier (SCR) devices are widely used as on-chip electrostatic discharge (ESD) protection due to their ESD robustness and the high current discharge capacity per unit area. When an SCR device is used in an integrated circuit device having a low supply voltage, the high triggering voltage of the SCR device may limit its range of applications. Therefore, some advanced techniques, such as low-voltage triggered SCR ("LVTSCR) have been proposed to improve the triggering efficiency of the SCR device. However, conventional low-voltage triggered SCR devices face the problems of high leakage current and large silicon area.

FIG. 1A illustrates a cross-sectional view of a conventional low-voltage triggered SCR device 10 formed on a P-type substrate 100. The SCR device 10 includes an N-well and a P-well abut one another and formed in the substrate 100. An N+ region 111 and a P+ region 101 are formed in the N-well, and an N+ region 102 and a P-well 112 are formed in the P-well. An additional N+ doped region 103 is formed in a region between the P+ doped region 101 and the N+ doped region 102. A portion of the N+ doped region 103 is disposed in the P-well, and a portion of the N+ doped region is disposed in the N-well. A gate structure 104 is formed on the semiconductor substrate 100 between the N+ doped region 102 and the N+ doped region 103. The gate structure 104 is connected to a cathode of the SCR device to form a gate-grounded NMOS transistor.

FIG. 1B illustrates a schematic circuit with an SCR 10'. As shown in FIG. 1B, the SCR 10' is connected between an anode and a cathode. The SCR 10' includes a PNP transistor, an NPN transistor, an NMOS transistor, a resistor $R_{NW}$, and a resistor $R_{PW}$. The PNP transistor has an emitter connected to the anode, a base connected to the drain of the NMOS transistor, and a collector connected to a source of the NMOS transistor and a base of the NPN transistor. The resistor $R_{NW}$ is connected between the anode and a drain of the NMOS transistor.

Referring to FIGS. 1A and 1B, the resistor $R_{NW}$ is substantially formed in the N-well, and the resistor $R_{PW}$ is substantially formed in the P-well. The P+ region 101, the N-well and the P-well form the PNP transistor. The N+ region 102, the P-well and the N-well form the NPN transistor.

When an ESD event occurs at the anode of the SCR device, the NMOS transistor turns on causing a current to flow through the resistor $R_{PW}$. The voltage drop across the resistor $R_{PW}$ turns on the bipolar NPN transistor and ultimately triggers the SCR device. The NMOS thus, reduces the trigger voltage of the SCR device. However, the sustaining voltage of the low trigger voltage SCR device is relatively low, so that when the SCR device is applied to a 3.3 V or 5 V I/O (input/output), the low sustaining voltage causes the SCR device to latch-up. This is because, when the SCR device is operating properly, the low sustaining voltage enables the SCR device to remain active (i.e., in the on state) in a low-impedance state even after the ESD event has passed. This effect is referred to as an ESD induced latch-up. Furthermore, the additional N+ region 103 disposed between the N-well and the P-well increases the silicon area.

Thus, there is a need to provide a novel silicon controlled rectifier structure to overcome the above-described deficiencies.

BRIEF SUMMARY OF THE INVENTION

Embodiments of the present invention provide an improved low-voltage triggered silicon controlled rectifier with high holding voltage and small silicon area and an electronic apparatus containing the same. The disclosed silicon controlled rectifier (alternatively and interchangeably referred to as semiconductor device or an SCR device) has been designed, manufactured, and measured in the 40 nm and 28 nm process nodes. The measured IV characteristics show an improvement of the devices according to embodiments of the present invention over conventional low-voltage triggered SCR devices having a larger silicon area.

In accordance with embodiments of the present invention, a semiconductor device includes a P-type semiconductor substrate, a first N-well, a second N-well, and a P-well formed in the semiconductor substrate. The P-well is formed between the first N-well and the second N-well and having opposite sides abutting the first N-well and the second N-well. The semiconductor device also includes a first doped region having a first conductivity type within the first N-well, a second doped region having a second conductivity type formed in a junction region between the first N-well and the P-well and spaced apart from the first doped region, a third N+ doped region formed in a junction region between the second N-well and the P-well and spaced apart from the second doped region, and a fourth P+ doped region within the second N-well and spaced apart from the third N+ doped region. The semiconductor device further includes a gate structure formed on the surface of the P-well between the second doped region and the third N+ doped region. The gate structure, the second doped region and the third N+ doped region form an NMOS structure.

In one embodiment, the first doped region and the second doped region form an anode of a silicon controlled rectifier (SCR) device. The third N+ doped region and the fourth P+ region form a cathode of the SCR device.

In one embodiment, the gate structure is connected to the cathode of the SCR device.

In one embodiment, the first conductivity type is P-type, the first doped region is a P+ doped region, the second conductivity type is N-type, and the second doped region is an N+ doped region.

In one embodiment, the first conductivity type is N-type, the first doped region is an N+ doped region, the second conductivity type is P-type, and the second doped region is a P+ doped region.

In one embodiment, a first insulation structure is formed between the first doped region and the second doped region, and a second insulation structure is formed between the third N+ doped region and the fourth P+ doped region. The first and second insulation structure may be shallow trench insulation structures.

Embodiments of the present invention also provide an electronic apparatus comprising a semiconductor device and an electronic component connected to the semiconductor device. The semiconductor device comprises a P-type semiconductor substrate, a first N-well, a second N-well, and a P-well in the semiconductor substrate, the P-well being disposed between the first N-well and the second N-well and having opposite sides abutting the first N-well and the second N-well, a first doped region having a first conductivity type within the first N-well, a second doped region having a second conductivity type formed in a junction region between the first N-well and the P-well and spaced apart from the first doped region, a third N+ doped region formed in a junction region between the second N-well and the P-well and spaced apart from the second doped region, a fourth P+ doped region within the second N-well and spaced apart from the third N+ doped region, and a gate structure formed on the surface of the P-well between the second doped region and the third N+ doped region. The gate structure, the second doped region and the third N+ doped region form an NMOS structure.

The following description, together with the accompanying drawings, will provide a better understanding of the nature and advantages of the claimed invention.

DETAILED DESCRIPTION OF THE INVENTION

Figure 1A:
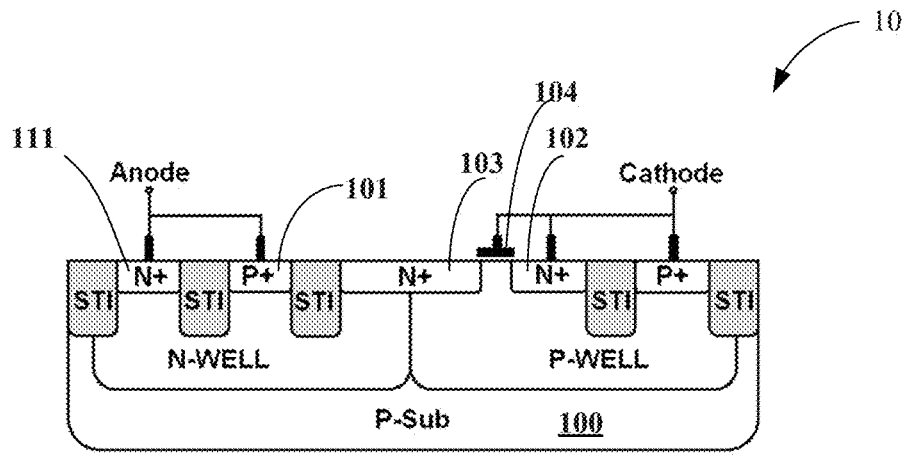
FIG. 1A is a cross-sectional view of a conventional low voltage triggered SCR device, as known in the prior art.
Figure 1B:
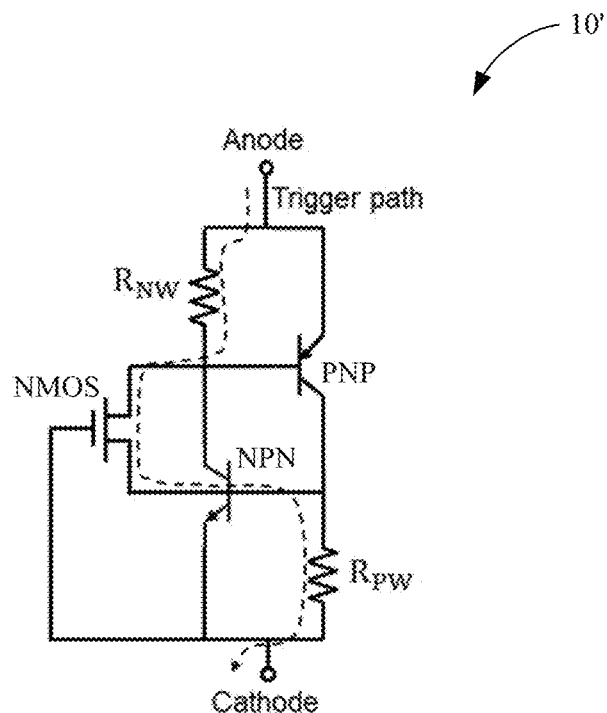
FIG. 1B is a schematic circuit of a low voltage triggered SCR device that can be applied to the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that when an element or layer is referred to as "on." "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention, Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

Figure 2:
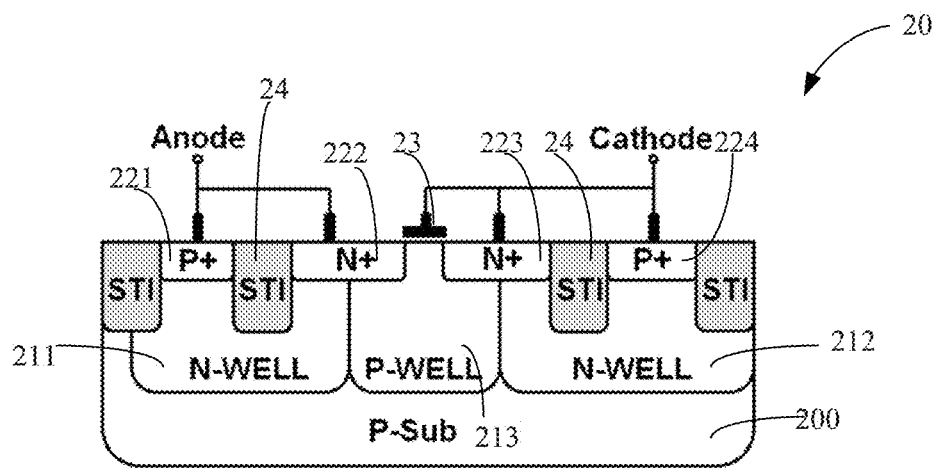
FIG. 2 is a cross-sectional view of a semiconductor device according to an embodiment of the present invention.

FIG. 2 is a cross-sectional view of a semiconductor device 20 according to an embodiment of the present invention. Semiconductor device 20 may be a low voltage triggered SCR (LVTSCR) device.

Semiconductor device 20 is formed in a P-type semiconductor substrate 200. Semiconductor substrate 200 may include, but not limited to, silicon, silicon on insulator (SOI), stacked SOI (SSOI), stacked SiGe on insulator (S—SiGeOI), SiGe on insulator (SiGeOI), Ge on insulator (GeOI), or combinations thereof. The P-type semiconductor substrate 200 is doped with a P-type dopant to a first impurity concentration.

The P-type semiconductor substrate 200 includes a first N-well 211, a second N-well 212, and a P-well 213 disposed between the first and second N-wells and adjoining the first and second N-wells (i.e., having opposite sides abutting the first and second N-wells).

The first N-well 211 includes a first doped region 221 having a first conductivity type. The semiconductor substrate 200 also includes a second doped region 222 having a second conductivity type formed in a junction region between the first N-well 211 and the P-well 213. The second doped region 222 is spaced away from the first doped region 221 and includes a first portion formed in the first N-well 211 and a second portion formed in the P-well 213 (i.e., the second doped region 222 is bridging the first N-well 211 and the P-well 213). In some embodiments, the first conductivity type is P-type, and the first doped region 221 is a P+ doped region. The second conductivity type is N-type, and the second doped region 222 is an N+ doped region. In other embodiments, the first conductivity type is N-type, and the first doped region 221 is an N+ doped region. The second conductivity type is P-type, and the second doped region 222 is a P+ doped region. Furthermore, the first doped region 221 and the second doped region 222 form the anode of the SCR device. It will be appreciated that the position of the first doped region 221 and the second doped region 222 can be interchanged without affecting the functionality of the SCR device. Hereinafter, the term "N+ doped region" refers to a heavily doped region having an N-type dopant concentration of greater than $1\times10^{19}$ atoms/cm$^3$. The term "P+ doped region" refers to a heavily doped region having a P-type dopant concentration of greater than $1\times10^{19}$ atoms/cm$^3$.

The P-type semiconductor substrate 200 further includes a third N+ doped region 223 formed between a junction region between the second N-well 212 and the P-well 213, i.e., the third N+ doped region 223 is bridging the second N-well 212 and the P-well 213. The third N+ region 223 is spaced away from the second doped region 222.

The P-type semiconductor substrate 200 further includes a fourth P+ doped region 224 formed in the N-well 212 and spaced away from the third N+ doped region 223. The SCR device 20 includes a gate structure 23 formed on the surface of the P-well between the second N+ doped region 222 and the third N+ doped region 223. The third N+ doped region and the fourth P+ doped region form a cathode of the SCR device.

A portion of the third N+ doped region 223 disposed in the P-well and a portion of the second doped region 222 disposed in the P-well together with the gate structure 23 form an NMOS structure. The gate structure 23 is connected to the cathode of the SCR device.

In some embodiments, insulation structures 24 may be formed between the first doped region 221 and second doped region 222, and between the third N+ doped region 223 and the fourth P+ doped region. In some embodiments, the insulation structures 24 may be shallow trench insulation (STI) structures.

In accordance with the present invention, the semiconductor device may be manufactured using conventional semiconductor processes without any additional process layers and masks. Thus, the manufacturing processes of the semiconductor device according to embodiments of the present invention are compatible with existing semiconductor manufacturing processes, such as processes for 40 nm, 28 nm, and below, without additional process costs.

Comparing with conventional SCR devices, the SCR device according to the present invention does not require an additional N+ doped region, thereby reducing the silicon area. Comparing with a conventional SCR device, the first P+ doped region in the N-well form an emitter, the N-well forms a base and the P-type semiconductor substrate forms a collector of a parasitic bipolar PNP transistor. In accordance with the present invention, the position of the first P+ doped region and the first N+ doped region can be interchanged (transposed) to increase the width of the base of the PNP transistor, thereby increasing the holding voltage of the SCR device.

Figure 3:
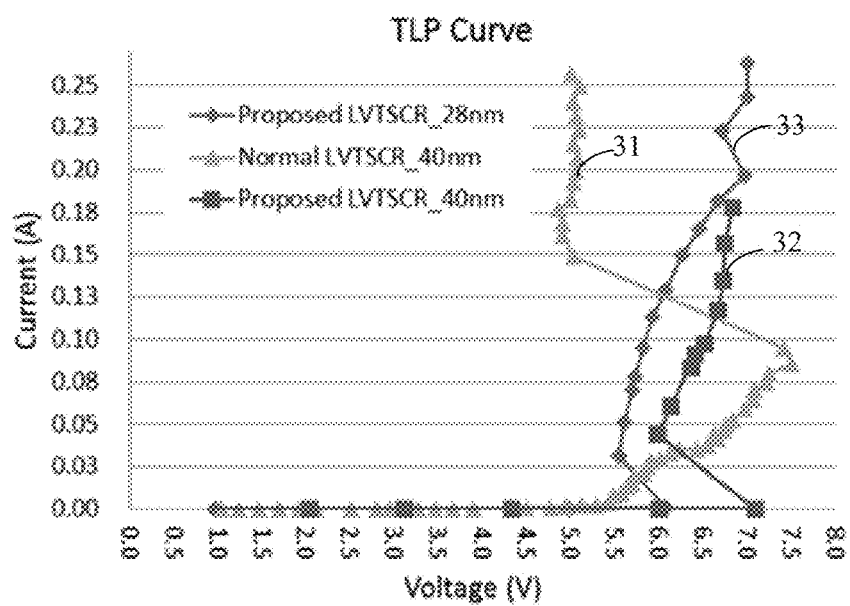
FIG. 3 is a graph illustrating current-voltage (I-V) characteristics of a conventional semiconductor device and semiconductor devices according to embodiments of the present invention.

Semiconductor devices according to embodiments of the present invention have been fabricated using 40 nm and 28 nm process nodes. Measurements have been conducted, and the results confirm the superior performance of the present invention. FIG. 3 is a graph illustrating measured data of current-voltage characteristics of a conventional semiconductor device and semiconductor devices according to the present invention. The x-axis represents the voltage, and the y-axis represents the current. The curves are generated via transmission line pulsing (TLP) current-voltage as known in the art. Curve 32 is of a conventional SCR device fabricated with a 40 nm process. Curves 42 and 43 are of SCR devices fabricated with respective 40 nm and 28 nm, in accordance with the present invention. It can be seen that a conventional SCR device at the 40 nm process node has a triggering voltage about 7.5 V and a holding voltage about 5.0 V, whereas the SCR devices at the 40 nm and 28 nm process nodes show a lower triggering voltage (7.0 V and 6.0 V, respectively) and a higher holding voltage of about 5.5 to 6.0 V. Thus, a SCR device according to the present invention has an improved ESD protection performance (relatively low triggering voltage and high holding voltage).

In summary, the present invention discloses a low voltage triggered SCR device that has a relatively higher holding voltage while consuming a smaller silicon area. The SCR device according to the present invention provides a better ESD protection and improved latch-up immunity comparing to a conventional SCR device.

Second Embodiment

Embodiments of the present invention also provide an electronic device including an electronic component and a semiconductor device connected to the electronic component. The semiconductor device can be the semiconductor device of embodiment 1.

In accordance with the present invention, the semiconductor device includes a P-type semiconductor substrate, a first N-well, a second N-well, and a P-well within the semiconductor substrate. The P-well is formed between the first and second N-wells having opposite sides abutting the first and second N-wells, i.e., the P-well is adjoining the first and second N-wells. The semiconductor device also includes a first doped region having a first conductivity type within the N-well, and a second doped region having a second conductivity type formed at a junction region between the first N-well and the P-well and spaced apart from the first doped region. In other words, the second doped region is bridging the first N-well and the P-well. The semiconductor device further includes a third N+ doped region formed at a junction region between the second N-well and the P-well and spaced apart from the second doped region, i.e., the third N+ doped region is bridging the second N-well and the P-well. In addition, the semiconductor device also includes a fourth P+ doped region formed within the N-well and spaced apart from the third N+ doped region. The semiconductor device also includes a gate structure formed on the surface of the P-well between the second doped region and the third N+ doped region. A portion of the third N+ doped region within the P-well, a portion of the second doped region within the P-well, and the gate structure form an NMOS structure.

In some embodiment, the first conductivity type is P-type, and the first doped region is a P+ doped region. The second conductivity type is N-type, and the second doped region is an N+ doped region.

In other embodiments, the first conductivity type is N-type, and the first doped region is an N+ doped region. The second conductivity type is P-type, and the second doped region is a P+ doped region.

In accordance with the present invention, the first doped region and the second doped region are an anode of an SCR device. The position of first doped region and the second doped region can be interchanged without affecting the functionality of the SCR device.

Because the semiconductor device consumes a small surface area of the semiconductor substrate while providing a higher holding voltage of the SCR device, the electronic device will have a better ESD protection and an improved latch-up immunity.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described semiconductor device to improve the ESD protection performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a P-type semiconductor substrate;
   a first N-well, a second N-well, and a P-well in the semiconductor substrate, the P-well being disposed between the first N-well and the second N-well and having opposite sides abutting the first N-well and the second N-well;
   a first doped region having a first conductivity type within the first N-well;
   a second doped region having a second conductivity type formed in a junction region between the first N-well and the P-well and spaced apart from the first doped region;
   a third N+ doped region formed in a junction region between the second N-well and the P-well and spaced apart from the second doped region;
   a fourth P+ doped region within the second N-well and spaced apart from the third N+ doped region; and
   a gate structure formed on the surface of the P-well between the second doped region and the third N+ doped region,
   wherein the gate structure, the second doped region and the third N+ doped region form an NMOS structure.

2. The semiconductor device of claim 1, wherein the first doped region and the second doped region are an anode of a silicon controlled rectifier (SCR) device.

3. The semiconductor device of claim 1, wherein the third N+ doped region and the fourth P+ region are a cathode of an SCR device.

4. The semiconductor device of claim 3, wherein the gate structure is connected to the cathode of the SCR device.

5. The semiconductor device of claim 1, wherein the first conductivity type is P-type, the first doped region is a P+ doped region, the second conductivity type is N-type, and the second doped region is an N+ doped region.

6. The semiconductor device of claim 1, wherein the first conductivity type is N-type, the first doped region is an N+ doped region, the second conductivity type is P-type, and the second doped region is a P+ doped region.

7. The semiconductor device of claim 1, wherein a first insulation structure is formed between the first doped region and the second doped region, and a second insulation structure is formed between the third N+ doped region and the fourth P+ doped region.

8. An electronic apparatus comprising a semiconductor device and an electronic component connected to the semiconductor device, wherein the semiconductor device comprises:

a P-type semiconductor substrate;

a first N-well, a second N-well, and a P-well in the semiconductor substrate, the P-well being disposed between the first N-well and the second N-well and having opposite sides abutting the first N-well and the second N-well;

a first doped region having a first conductivity type within the first N-well;

a second doped region having a second conductivity type formed in a junction region between the first N-well and the P-well and spaced apart from the first doped region;

a third N+ doped region formed in a junction region between the second N-well and the P-well and spaced apart from the second doped region;

a fourth P+ doped region within the second N-well and spaced apart from the third N+ doped region; and a gate structure formed on the surface of the P-well between the second doped region and the third N+ doped region, the gate structure, the second doped region and the third N+ doped region forming an NMOS structure.

* * * * *